United States Patent
Yoshida et al.

(10) Patent No.: US 8,162,725 B2
(45) Date of Patent: Apr. 24, 2012

(54) ABRASIVE, METHOD OF POLISHING TARGET MEMBER AND PROCESS FOR PRODUCING SEMICONDUCTOR DEVICE

(75) Inventors: Masato Yoshida, Ibaraki-ken (JP); Toranosuke Ashizawa, Ibaraki-ken (JP); Hiroki Terazaki, Ibaraki-ken (JP); Yuuto Ootuki, Ibaraki-ken (JP); Yasushi Kurata, Ibaraki-ken (JP); Jun Matsuzawa, Ibaraki-ken (JP); Kiyohito Tanno, Ibaraki-ken (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 156 days.

(21) Appl. No.: 11/878,504

(22) Filed: Jul. 25, 2007

(65) Prior Publication Data

US 2007/0266642 A1    Nov. 22, 2007

Related U.S. Application Data

(60) Division of application No. 11/484,611, filed on Jul. 12, 2006, which is a continuation of application No. 10/042,271, filed on Jan. 11, 2002, now Pat. No. 7,115,021, which is a continuation of application No. 09/581,814, filed as application No. PCT/JP98/05736 on Dec. 18, 1998, now Pat. No. 6,343,976.

(30) Foreign Application Priority Data

Dec. 18, 1997  (JP) .................................. 09-349240
Mar. 30, 1998  (JP) .................................. 10-083042
Mar. 30, 1998  (JP) .................................. 10-083043

(51) Int. Cl.
*B24B 1/00*    (2006.01)

(52) U.S. Cl. ................. 451/41; 51/301; 51/305; 51/309

(58) Field of Classification Search .................... 451/41; 51/301, 308, 309
See application file for complete search history.

(56) References Cited

U.S. PATENT DOCUMENTS

| | | |
|---|---|---|
| 4,462,188 A | 7/1984 | Payne |
| 4,475,981 A | 10/1984 | Rea |
| 4,588,421 A | 5/1986 | Payne |
| 4,954,142 A | 9/1990 | Carr et al. |
| 4,959,113 A | 9/1990 | Roberts |
| 5,011,671 A | 4/1991 | Le Loarer |
| 5,026,421 A | 6/1991 | Le Loarer et al. |
| 5,260,249 A | 11/1993 | Shiraishi et al. |
| 5,264,010 A | 11/1993 | Brancaleoni et al. |
| 5,389,352 A | 2/1995 | Wang |
| 5,525,559 A | 6/1996 | Metcalfe et al. |
| 5,527,423 A | 6/1996 | Neville et al. |
| 5,543,126 A | 8/1996 | Ota et al. |
| 5,653,775 A | 8/1997 | Plovnick et al. |
| 5,697,992 A | 12/1997 | Ueda et al. |
| 5,766,279 A | 6/1998 | Ueda et al. |
| 5,772,780 A | 6/1998 | Homma et al. |
| 5,775,980 A | 7/1998 | Sasaki et al. |
| 5,804,513 A | 9/1998 | Sakatani et al. |
| 5,858,813 A | 1/1999 | Scherber et al. |
| 5,876,490 A | 3/1999 | Ronay |
| 5,891,205 A | 4/1999 | Picardi et al. |
| 5,994,260 A | 11/1999 | Bonneau et al. |
| 5,997,620 A | 12/1999 | Kodama et al. |
| 6,039,631 A | 3/2000 | Sato et al. |
| 6,120,571 A | 9/2000 | Aihara et al. |
| 6,221,118 B1 | 4/2001 | Yoshida et al. |
| 6,863,700 B2 | 3/2005 | Yoshida et al. |
| 7,192,461 B2 | 3/2007 | Morii et al. |
| 2002/0016060 A1* | 2/2002 | Matsuzawa et al. .......... 438/633 |

FOREIGN PATENT DOCUMENTS

| | | |
|---|---|---|
| CA | 2263241 | 9/1998 |
| EP | 0 820 092 | 1/1998 |
| EP | 0 939 431 | 9/1999 |
| FR | 2583034 | 12/1986 |
| JP | 53-6756 | 1/1978 |
| JP | 53-6756 | 3/1978 |
| JP | 60-108489 | 6/1985 |
| JP | 63-045125 | 2/1988 |
| JP | 64-040267 | 2/1989 |
| JP | 1-266183 | 10/1989 |
| JP | 02-097424 | 4/1990 |
| JP | 04-202069 | 7/1992 |
| JP | 05-004868 | 1/1993 |
| JP | 06-216096 | 8/1994 |
| JP | 06-330025 | 11/1994 |
| JP | 07-070553 | 3/1995 |

(Continued)

OTHER PUBLICATIONS

Judicial Decision in connection with JP (Laid-open 9-14371, delivered on Jun. 20, 2006.

(Continued)

*Primary Examiner* — Lee D Wilson
*Assistant Examiner* — Shantese McDonald
(74) *Attorney, Agent, or Firm* — Antonelli, Terry, Stout & Kraus, LLP.

(57) ABSTRACT

To polish polishing target surfaces of $SiO_2$ insulating films or the like at a high rate without scratching the surface, the present invention provides an abrasive comprising a slurry comprising a medium and dispersed therein at least one of i) cerium oxide particles constituted of at least two crystallites and having crystal grain boundaries or having a bulk density of not higher than 6.5 $g/cm^3$ and ii) abrasive grains having pores. Also provided are a method of polishing a target member and a process for producing a semiconductor device which make use of this abrasive.

20 Claims, No Drawings

FOREIGN PATENT DOCUMENTS

| | | |
|---|---|---|
| JP | 07-81932 | 3/1995 |
| JP | 7-502778 | 3/1995 |
| JP | 07-172826 | 7/1995 |
| JP | 07-172933 | 7/1995 |
| JP | 08-003541 | 1/1996 |
| JP | 08-022970 | 1/1996 |
| JP | 08-081218 | 3/1996 |
| JP | 08-181218 | 3/1996 |
| JP | H8-81218 * | 3/1996 |
| JP | 8-134435 | 5/1996 |
| JP | 08-134435 | 5/1996 |
| JP | 08-153696 | 6/1996 |
| JP | 08-168954 | 7/1996 |
| JP | 08-197414 | 8/1996 |
| JP | 08-333157 | 12/1996 |
| JP | 2592401 | 12/1996 |
| JP | 09-048672 | 2/1997 |
| JP | 09-270402 | 10/1997 |
| JP | 10-001376 | 1/1998 |
| JP | 10-106992 | 4/1998 |
| JP | 10-152673 | 6/1998 |
| JP | 11-012561 | 1/1999 |
| KR | 13577 | 10/1996 |
| WO | WO 93/22103 | 11/1993 |
| WO | WO 97/29510 | 8/1997 |
| WO | WO 98/14987 | 4/1998 |
| WO | WO 01/13417 A1 | 10/1999 |

OTHER PUBLICATIONS

Official Action, for Application No. EP 98 961 410.2, dated Feb. 21, 2007
Official Action, for Korean Application No. 10-2006-7024950, mailed Jan. 30, 2007
Official Action, for Korean Application No. 10-2006-7024951, mailed Jan. 30, 2007
Canadian Office Action, for Application No. 2,315,057, dated May 9, 2003.
Canadian Office Action, for Application No. 2,315,057, dated Jul. 7, 2004.
Canadian Office Action, for Application No. 2,315,057, dated Aug. 15, 2005.
Communication and European Search Report mailed Jun. 18, 2004, for No. EP 98 96 1410.
Japanese Office Action for corresponding Application No. JP 2000-539103, date May 25, 2004 with English-language translation.
1996 Proceedings First International Chemical-Mechanical Polish (C.M.P.) for VLSI/ULSI Multilevel Interconnection Conference (CMP-MIC) "Selective CMP of Organic Sog for Low Parasitic Capacitance Quarter-Micron Multilevel Interconnections", By: Yoshio Homa, et al. Feb. 22-23, 1996.
"The Rietveld Method", Oxford University Press (1993).
McGraw-Hill Dictionary of Scientific and Technical Terms (5$^{th}$ Ed.) (1994) p. 388.
"Particle Size Distributions from Angular Variation of Intensity of Forward-Scattered Light at Very Small Angles" J. Chem. Phys., vol. 59, pp. 841-844 (1955).
"The Determination of Pore Volume and Area Distribution in Porous Substances. I. Computations from Nitrogen Isotherms"J. Am. Chem. Soc., vol. 73, pp. 373-380.
Official Action, for Korean Application No. 10-2007-7007309, mailed Jun. 20, 2007.
Chinese Official Action for Application No. 200610058544.9, mailed Aug. 10, 2007.
European Official Action issued Jul. 11, 2008, for Application No. 98 961 410.2-1218.
Canadian Official Action issued on Apr. 21, 2008, for Application No . 2,315,057.
Japanese Official Action issued on Mar. 10, 2009, in Application No. 2008-3672.
Trial Decision (Decision on Appeal) issued on Mar. 31, 2009, in Appeal No. 2007-31006.
Extended European Search Report dated Oct. 31, 2008, for Application No. EP 07 10 9339.
Japanese Official Action issued Sep. 24, 2008, for Application No. 2001-103923.
Japanese Official Action issued Sep. 24, 2008, for Application No. 2001-275530.
Chinese Office Action issued Jun. 27, 2008, for Application No. 2006100585449; partial translation of Chinese Office Action issued Jun. 27, 2008.
European Official Action issued Feb. 26, 2009, for Application No. 98961410.2-1218/1043379.
Japanese Official Action issued on Jan. 5, 2010, in Application No. 2006-335090, 2006-335091.
Japanese Official Action issued on Jan. 19, 2010, in Application No. 2003-394020.
Japanese Official Action issued Jun. 1, 2010, for Application No. 2006-335086.
Japanese Official Action issued Jun. 1, 2010, for Application No. 2006-335088.
Japanese Official Action issued Jun. 1, 2010, for Application No. 2006-335113.
Japanese Official Action issued Jun. 1, 2010, for Application No. 2006-335115.
Japanese Official Action issued Jun. 1, 2010, for Application No. 2006-335116.
Japanese Official Action issued Sep. 14, 2010, for Application No. 2003-394020.
Japanese Official Action (Appeal Questioning) dated Sep. 28, 2010, for Application No. 2006-335090 (Appeal No. 2010-6942).
Japanese Official Action (Appeal Questioning) dated Sep. 28, 2010, for Application No. 2006-335091 (Appeal No. 2010-6941).

* cited by examiner

ABRASIVE, METHOD OF POLISHING TARGET MEMBER AND PROCESS FOR PRODUCING SEMICONDUCTOR DEVICE

CROSS REFERENCE TO RELATED APPLICATIONS

This application is a Divisional application of application Ser. No. 11/484,611, filed Jul. 12, 2006, which is a Continuation Application of application Ser. No. 10/042,271, filed Jan. 11, 2002 now U.S. Pat. No. 7,115,021, which is a Continuation Application of application Ser. No. 09/581,814, submitted on Jun. 19, 2000, and having a 371(c) date of Sep. 8, 2000 now U.S. Pat. No. 6,343,976. The contents of Ser. No. 09/581,814 are incorporated herein by reference in their entirety. Ser. No. 09/581,814 is a National Stage Application filed under 35 U.S.C. § 371 of International (PCT) Application No. PCT/JP98/05736, filed Dec. 18, 1998.

TECHNICAL FIELD

This invention relates to an abrasive, a method of polishing a target member, and a process for producing a semiconductor device.

BACKGROUND ART

Conventionally, in the steps of fabricating semiconductor devices, studies are commonly made on colloidal silica type abrasives used as chemical mechanical abrasives for smoothing inorganic insulating film layers such as $SiO_2$ insulating films formed by processes such as plasma-assisted CVD (chemical vapor deposition) and low-pressure CVD. The colloidal silica type abrasives are produced by growing silica particles into grains by a method of, e.g., thermal decomposition of tetrachlorosilicic acid, and making pH adjustment with an alkali solution containing no alkali metal, such as ammonia. Such abrasives, however, can not provide any sufficient rate of polishing for the polishing of inorganic insulating films, and have a technical problem of low polishing rate for their practical utilization.

Meanwhile, cerium oxide abrasives are used as glass surface abrasives for photomasks. Cerium oxide particles are useful for finish mirror-polishing because they have a lower hardness than silica particles and alumina particles and hence may hardly scratch polished surfaces. Also, cerium oxide, which is known as a strong oxidant, has chemically active nature. Making the most of this advantage, its application in chemical mechanical abrasives for the insulating films is useful. However, when such cerium oxide abrasives for glass surface abrasives for photomasks are used in the polishing of inorganic insulating films as they are, they have so large a primary particle diameter as to scratch, on polishing, the insulating film surface to a visually observable extent.

DISCLOSURE OF THE INVENTION

An object of the present invention is to provide an abrasive that can polish polishing target surfaces of $SiO_2$ insulating films or the like at a high rate without scratching the surface, a method polishing a target member, and a process for producing a semiconductor device.

The present invention provides an abrasive comprising a slurry comprising a medium and dispersed therein cerium oxide particles constituted of at least two crystallites and having crystal grain boundaries.

The cerium oxide particles having crystal grain boundaries may preferably have diameter with a middle value of from 60 nm to 1,500 nm, more preferably from 100 nm to 1,200 nm, and most preferably from 300 nm to 1,000 nm. The crystallites may preferably have diameter with a middle value of from 5 nm to 250 nm, and more preferably from 5 nm to 150 nm. Preferably usable are particles wherein the cerium oxide particles having crystal grain boundaries have diameter with a middle value of from 300 nm to 1,000 nm and the crystallites have diameter with a middle value of from 10 nm to 50 nm. Also preferably usable are particles wherein the cerium oxide particles having crystal grain boundaries have diameter with a middle value of from 300 nm to 1,000 nm and the crystallites have diameter with a middle value of from 50 nm to 200 nm. The cerium oxide particles having crystal grain boundaries may preferably have a maximum diameter not larger than 3,000 nm, and the crystallites may preferably have a maximum diameter not larger than 600 nm. Those in which the crystallites have a diameter of from 10 nm to 600 nm are preferred.

The present invention also provides an abrasive comprising a slurry comprising a medium and dispersed therein abrasive grains having pores. As the abrasive grains, cerium oxide particles may preferably be used.

The pore may preferably be in a porosity of from 10% to 30% as determined from the ratio of a density measured with a pycnometer to a theoretical density determined by X-ray Rietvelt analysis. The pores may also preferably have a pore volume of from $0.02\ cm^3/g$ to $0.05\ cm^3/g$ as measured by the B.J.H. (Barret, Joyner and Halende) method.

The present invention still also provides an abrasive comprising a slurry comprising a medium and dispersed therein cerium oxide particles having a bulk density not higher than $6.5\ g/cm^3$. Those having a bulk density of from $5.0\ g/cm^3$ to $5.9\ g/cm^3$ are preferred.

As the medium, water may preferably be used. The slurry may contain a dispersant. The dispersant may preferably be at least one selected from a water-soluble organic polymer, a water-soluble anionic surface-active agent, a water-soluble nonionic surface-active agent and a water-soluble amine. Ammonium polyacrylate may preferably be used.

The present invention further provides an abrasive comprising cerium oxide particles constituted of at least two crystallites and having crystal grain boundaries; cerium oxide particles with a diameter not smaller than 1 µm occupying at least 0.1% by weight of the total weight of the cerium oxide particles, and the cerium oxide particles having crystal grain boundaries being capable of polishing a target member while collapsing at the time of polishing.

The present invention still further provides an abrasive comprising cerium oxide particles constituted of at least two crystallites and having crystal grain boundaries; the cerium oxide particles having crystal grain boundaries being capable of polishing a target member while forming new surfaces not coming into contact with any medium at the time of polishing.

The present invention still further provides an abrasive comprising cerium oxide particles constituted of at least two crystallites and having crystal grain boundaries, wherein;

(1) the content of cerium oxide particles having a particle diameter not smaller than 0.5 µm after polishing, measured by centrifugal sedimentation after a target member has been polished, is in a ratio of not more than 0.8 with respect to the content of cerium oxide particles having a particle diameter not smaller than 0.5 µm before polishing, measured likewise by centrifugal sedimentation;

(2) cerium oxide particle diameter at D99% by volume after polishing, measured by laser diffraction after a target member has been polished, is in a ratio of from 0.4 to 0.9 with respect to cerium oxide particle diameter at D99% by volume before polishing, measured likewise by laser diffraction; and (3) cerium oxide particle diameter at D90% by volume after polishing, measured by laser diffraction after a target member has been polished, is in a ratio of from 0.7 to 0.95 with respect to cerium oxide particle diameter at D90% by volume before polishing, measured likewise by laser diffraction.

The method of polishing a target member according to the present invention comprises polishing a target member by the use of the abrasive described above. The target member may preferably have a strength higher than the grain boundary breaking strength of the cerium oxide particles. The target member may be a semiconductor chip on which a silica film has been formed.

The process for producing a semiconductor device according to the present invention comprises the step of polishing a semiconductor chip on which a silica film has been formed, by the use of the abrasive described above.

BEST MODE FOR PRACTICING THE INVENTION

Cerium oxide is commonly obtained by firing a cerium compound such as carbonate, sulfate or oxalate. $SiO_2$ insulating films formed by TEOS(tetraethoxysilane)-CVD can be polished at a higher rate as the cerium oxide has larger particle diameter and can have less crystal strain, i.e., has better crystallizability, but tend to be scratched on polishing. Accordingly, the cerium oxide particles used in the present invention are prepared without making them highly crystallizable so much. Also, since they are used in polishing for semiconductor chips, alkali metals and halogens may preferably be kept in a content of 1 ppm or less.

The abrasive of the present invention has so high a purity as to contain 1 ppm or less each of Na, K, Si, Mg, Ca, Zr, Ti, Ni, Cr and Fe and 10 ppm or less of Al.

In the present invention, the cerium oxide particles may be prepared by firing. However, in order to prepare particles not causative of polish scratches, low-temperature firing is preferred which does not make them highly crystallizable as far as possible. Since the cerium compounds have an oxidation temperature of 300° C., they may preferably be fired at a temperature of from 400° C. (inclusive) to 900° C. (inclusive). It is preferable to fire cerium carbonate at a temperature of from 400° C. (inclusive) to 900° C. (inclusive) for 5 to 300 minutes in an oxidizing atmosphere of oxygen gas or the like.

Cerium oxide formed by baking may be pulverized by dry-process pulverization using a jet mill, a ball mill or the like, or by wet-process pulverization using a beads mill, a ball mill or the like. In cerium oxide particles obtained by pulverizing the fired cerium oxide, single-crystal particles having a small crystallite size and pulverized particles having not been pulverized to crystallite size are contained. The pulverized particles differ from agglomerates formed by re-agglomeration of single-crystal particles, and are constituted of at least two crystallites and have crystal grain boundaries. Where the polishing is carried out using an abrasive containing such pulverized particles having crystal grain boundaries, it is presumed that the particles are broken by the stress at the time of polishing to bring about active surfaces, which surfaces are considered to contribute to the high-rate polishing without scratching the polishing target surfaces of $SiO_2$ insulating films or the like.

In the present invention, a cerium oxide slurry is obtained by subjecting to dispersion an aqueous solution containing the cerium oxide particles produced in the manner described above, or a composition comprised of cerium oxide particles collected from this aqueous solution, water and optionally a dispersant. The cerium oxide particles may optionally be classified through a filter. Here are no particular limitations on the concentration of the cerium oxide particles. In view of readiness to handle suspensions (abrasive), it may preferably be within the range of from 0.5 to 10% by weight.

The dispersant may include, as those containing no metal ions, water-soluble organic polymers such as acrylic acid type polymers and polyvinyl alcohol, water-soluble anionic surfactants such as ammonium lauryl sulfate and ammonium polyoxyethylene lauryl ether sulfate, water-soluble nonionic surfactants such as polyoxyethylene lauryl ether and polyethylene glycol monostearate, and water-soluble amines such as monoethanolamine and diethanolamine. The acrylic acid type polymers may include, e.g., polyacrylic acid and ammonium salts thereof, polymethacrylic acid and ammonium salts thereof, and copolymers of ammonium polyacrylate with alkyl (methyl, ethyl or propyl) acrylates.

Of these, ammonium polyacrylate or a copolymer of ammonium polyacrylate with methyl acrylate is preferred. When the latter is used, the ammonium polyacrylate and the methyl acrylate may preferably be in a molar ratio of ammonium polyacrylate/methyl acrylate of from 10/90 to 90/10.

The acrylic acid type polymers may also have a weight-average molecular weight of from 1,000 to 20,000. Those having a weight-average molecular weight more than 20,000 tend to cause changes with time of particle size distribution as a result of re-agglomeration. Those having a weight-average molecular weight less than 1,000 can not, in some cases, well be effective for providing dispersibility and preventing sedimentation.

In view of the dispersibility and prevention of sedimentation of particles in the slurry, any of these dispersant may be added in an amount ranging from 0.01 part by weight to 5 parts by weight based on 100 parts by weight of the cerium oxide particles. In order to improve its dispersion effect, the dispersant and the particles may preferably be added simultaneously in a dispersion machine at the time of dispersion treatment. If the amount is less than 0.01 part by weight based on 100 parts by weight of the cerium oxide particles, the particles tend to settle. If the amount is more than 5 parts by weight, the particle size distribution tends to change with time because of re-agglomeration.

As methods of dispersing these cerium oxide particles in water, they may be dispersion-treated by means of a conventional stirrer. Besides, a homogenizer, an ultrasonic dispersion machine or a ball mill or the like may be used. In order to disperse cerium oxide particles having a size of submicron order, a wet-process dispersion machine such as a ball mill, a vibratory ball mill, a planetary ball mill, a media agitating mill or the like may be used. Also, when the slurry should be made highly alkaline, an alkali substance containing no metal ions, such as ammonia water may be added at the time of dispersion treatment or after the treatment.

The cerium oxide abrasive of the present invention may be used in the form of the above slurry as it is. Alternatively, additives such as N,N-diethylethanolamine, N,N-dimethylethanolamine, aminoethylethanolamine, an anionic surfactant and polyvinyl alcohol or the dispersant described above may appropriately be added in accordance with the form of use to make up the abrasive.

The cerium oxide particles having crystal grain boundaries, to be contained dispersedly in the slurry of the present invention, may preferably have diameter with a middle value of from 60 nm to 1,500 nm, and the crystallites may preferably have diameter with a middle value of from 1 nm to 250 nm.

If the cerium oxide particles having crystal grain boundaries have diameter with a middle value smaller than 60 nm or the crystallites have diameter with a middle value smaller than 1 nm, it tends to be difficult to polish the polishing target surfaces of $SiO_2$ insulating films and the like at a high rate. If the cerium oxide particles having crystal grain boundaries have diameter with a middle value larger than 1,500 nm or the crystallites have diameter with a middle value larger than 250 nm, the polishing target surfaces of $SiO_2$ insulating films and the like tend to be scratched. If the cerium oxide particles having crystal grain boundaries have a maximum diameter larger than 3,000 nm, the polishing target surfaces of $SiO_2$ insulating films and the like tend to be scratched. The cerium oxide particles having crystal grain boundaries may preferably be in a content of from 5 to 100% by volume of the whole cerium oxide particles. If they are less than 5% by volume, the polishing target surfaces of $SiO_2$ insulating films and the like tend to be scratched.

In the above cerium oxide particles, the crystallites may preferably have a maximum diameter not larger than 600 nm, and the crystallites may preferably have a diameter of from 10 nm to 600 nm If the crystallites have a diameter larger than 600 nm, the polishing target surfaces tend to be scratched. If they have a diameter smaller than 10 nm, the polishing rate tends to be lower.

In the present invention, the diameters of the crystallites and cerium oxide particles having crystal grain boundaries are measured by observation with a scanning electron microscope (e.g., S-900, manufactured by Hitachi Ltd.). The particle diameter of particles is determined from the length and breadth of the particle. More specifically, the length and breadth of the particle are measured and the square root of the product of the length and breadth is regarded as particle diameter. Also, the volume of a sphere that is determined from the particle diameter thus determined is regarded as the volume of the particle.

The middle value is the middle value of volume-based particle size distribution and is meant to be a particle diameter at which the value obtained by adding the volume proportions of particles from among those having smaller particle diameters comes to be 50%. More specifically, when particles in an amount of volume proportion Vi% are present within the range of particle diameters in a certain interval Δ and where an average particle diameter in the interval Δ is represented by di, particles having particle diameter di are assumed to be present in an amount of Vi% by volume. The di at which the value obtained by adding existence proportion Vi (% by volume) of particles from among those having smaller particle diameters di comes to be Vi=50% is regarded as the middle value.

The cerium oxide particles having pores, to be contained dispersedly in the slurry of the present invention, may preferably have a porosity of from 10 to 30%. This porosity is determined by calculating it from the ratio of a density measured (pure water, 20° C.) with a pycnometer to a theoretical density determined by X-ray Rietvelt analysis. The cerium oxide particles having pores may preferably have a pore volume of from 0.02 to 0.05 $cm^3/g$.

If the cerium oxide particles have a porosity lower than 10% or a pore volume smaller than 0.02 $cm^3/g$, the polishing target surfaces of $SiO_2$ insulating films and the like can be polished at a high rate but tend to be scratched on polishing. If on the other hand they have a porosity higher than 30% or a pore volume larger than 0.05 $cm^3/g$, the polishing target surfaces of $SiO_2$ insulating films and the like, though not scratched on polishing, tend to be polished at a low rate.

The present invention also provides an abrasive comprising a slurry comprising a medium and dispersed therein cerium oxide particles having a bulk density not higher than 6.5 $g/cm^3$. If the cerium oxide particles have a bulk density higher than 6.5 $g/cm^3$, the polishing target surfaces of $SiO_2$ insulating films may be scratched. The cerium oxide particles may preferably have a bulk density of from 5.0 to 5.9 $g/cm^3$. If it is lower than this lower limit value, the polishing rate may lower. If it is higher than the upper limit value, the polishing target surfaces tend to be scratched. The bulk density referred to in the present specification is the density of powder measured with a pycnometer. In the measurement, pure water is used as the liquid injected into the pycnometer, and the measurement was made at 20° C.

Primary particles constituting the cerium oxide particles contained dispersedly in the slurry of the present invention may preferably have an aspect ratio of from 1 to 2 and a middle value of 1.3. The aspect ratio is measured with a scanning electron microscope (e.g., S-900, manufactured by Hitachi Ltd.).

The slurry of the present invention may preferably have a pH of from 7 to 10, and more preferably from 8 to 9.

The slurry, after adjustment of its pH, may be put in a container made of polyethylene or the like, and may be used after it has been left at 5 to 55° C. for 7 days or more, and preferably 30 days or more, whereby the polishing target surfaces can be made to be less scratched. The slurry of the present invention can stand dispersed so well and may settle so slowly that its rate of change in concentration after leaving for 2 hours is less than 10% at any height in a columnar container of 10 cm diameter and 1 m high.

The present invention further provides an abrasive comprising cerium oxide particles constituted of at least two crystallites and having crystal grain boundaries; cerium oxide particles with a diameter not smaller than 1 μm occupying at least 0.1% by weight of the total weight of the cerium oxide particles, and the cerium oxide particles having crystal grain boundaries being capable of polishing a target member while collapsing at the time of polishing. The cerium oxide particles having a diameter not smaller than 1 μm may preferably be in a content of from 0.1 to 50% by weight, and more preferably from 0.1 to 30% by weight.

The content of the cerium oxide particles having a diameter not smaller than 1 μm is measured by measuring the intensity of light transmitted through particles while being shut out by the particles, using a submerged-particle counter. As a measuring device, for example Model 770 AccuSizer (trade name), manufactured by Particle Sizing System, Inc., may be used.

The present invention still further provides an abrasive in which, when a target member is polished, the cerium oxide particles having crystal grain boundaries are capable of polishing the target member while forming new surfaces not coming into contact with any medium.

The present invention still further provides an abrasive in which the content of cerium oxide particles having a particle diameter not smaller than 0.5 μm after polishing, measured by centrifugal sedimentation after a target member has been polished, is in a ratio of not less than 0.001 with respect to the content of that before polishing. The centrifugal sedimentation is a method of measuring the content of cerium oxide particles by measuring the intensity of light transmitted through particles having been settled by centrifugal force. As a measuring device, for example SA-CP4L (trade name), manufactured by shimadzu Corporation, may be used.

The present invention still further provides an abrasive in which cerium oxide particle diameter at D99% by volume after polishing, measured by laser diffraction after a target member has been polished, is capable of being in a ratio of from 0.4 to 0.9 with respect to cerium oxide particle diameter at D99% by volume before polishing.

In the abrasive of the present invention, cerium oxide particle diameter at D90% by volume after polishing, measured by laser diffraction after a target member has been polished, may also be capable of being in a ratio of from 0.7 to 0.95 with respect to cerium oxide particle diameter at D90% by volume before polishing.

Incidentally, the terms "after a target member has been polished" is meant to be "after a polishing target surface has been polished by i) setting a target member to a holder to which a substrate-attaching suction pad for holding a target member to be polished has been fastened, ii) putting the holder with the polishing target surface side down, on a platen to which a polishing pad made of a porous urethane resin, iii) further putting a weight so as to apply a working load of 300 g/cm², and iv) rotating the platen at 30 rpm for 1 hour while dropping the above abrasive on the platen at a rate of 50 ml/minute." Here, the abrasive after polishing is circulated to be reused, and 750 ml of the abrasive is used in total.

The measurement by laser diffraction may be made using, e.g., Master Sizer Microplus (refractive index: 1.9285; light source: He—Ne laser; absorption: 0), manufactured by Malvern Instruments Ltd.

The D99% and D90% are meant to be particle diameters at which the values obtained by adding the volume proportions of particles from among those having smaller particle diameters come to be 99% and 90%, respectively.

The inorganic insulating films on which the cerium oxide abrasive of the present invention is applied may include $SiO_2$ films formed by CVD using $SiH_4$ or tetraethoxysilane as a silicon source and oxygen or ozone as an oxygen source.

As the target member, usable are, e.g., substrates such as semiconductor substrates standing at the stage where circuit components and aluminum wiring have been formed thereon and semiconductor substrates standing at the stage where circuit components have been formed thereon, and on which an $SiO_2$ insulating film has been formed (semi-fabricated substrates). Also usable are substrates having an $SiO_2$ insulating film formed for the purpose of semiconductor isolation (shallow trench isolation). $SiO_2$ insulating films formed on such semiconductor substrates are polished with the above abrasive to eliminate the unevenness of the $SiO_2$ insulating film surfaces to make the surfaces smooth over the whole semi-fabricated semiconductor substrate surfaces. Here, as an apparatus for the polishing, any commonly available polishing apparatus may be used which have a platen to which a holder for holding a semi-fabricated semiconductor substrate and a polishing cloth (pad) have been fastened (fitted with a motor whose number of revolutions is variable). As the polishing cloth, commonly available nonwoven fabric, foamed polyurethane, porous fluorine resin and so forth may be used without any particular limitations. The polishing cloth may also preferably be grooved so that the slurry can stand there. There are no particular limitations on polishing conditions. The platen may preferably be rotated at a low number of revolutions of 100 or less. The pressure applied to the semi-fabricated semiconductor substrate may preferably be not higher than 1 kg/cm² so as not to cause scratches after polishing. In the course of polishing, the slurry is continuously fed to the polishing cloth by means of a pump or the like. There are no particular limitations on the feed rate, provided that the surface of the polishing cloth may preferably be always covered with the slurry.

The semi-fabricated semiconductor substrate having been thus polished may preferably be cleaned well in running water and thereafter set on a spin-dryer to drive off any drops of water adhering to the polished semi-fabricated semiconductor substrate, followed by drying. On the $SiO_2$ insulating film thus made flat, second-layer aluminum wirings are formed, and an $SiO_2$ insulating film is again formed between, and on, the wirings by the above process. Thereafter, the film is polished with the above cerium oxide abrasive to eliminate the unevenness of the insulating film surface to make the surface flat over the whole semi-fabricated semiconductor substrate surface. This step is repeated prescribed times to produce a semiconductor having the desired number of layers.

The cerium oxide abrasive of the present invention may be used to polish not only the $SiO_2$ insulating films formed on semiconductor substrates, but also $SiO_2$ insulating films formed on wiring boards having certain wirings; glass; inorganic insulating films such as silicon nitride films; optical glass such as photomasks, lenses and prisms; inorganic conductive films such as ITO (indium tin oxide) films; optical integrated circuits, photoswitches or optical waveguides which are constituted of glass and a crystalline material; ends of optical fibers; optical single crystals such as scintillators; solid-state laser single crystals; LED sapphire substrates for blue-color lasers; semiconductor single crystals such as SiC, GaP and GaAs; glass substrates for magnetic disks; magnetic heads, and the like.

Thus, in the present invention, the target member embraces semiconductor substrates on which $SiO_2$ insulating films have been formed, wiring boards on which $SiO_2$ insulating films have been formed; glass; inorganic insulating films such as silicon nitride films; optical glass such as photomasks, lenses and prisms; inorganic conductive films such as ITO films; optical integrated circuits, photoswitches or optical waveguides which are constituted of glass and a crystalline material; ends of optical fibers; optical single crystals such as scintillators; solid-state laser single crystals; LED sapphire substrates for blue-color lasers; semiconductor single crystals such as SiC, GaP and GaAs; glass substrates for magnetic disks; magnetic heads, and the like.

EXAMPLE 1

(1) Preparation of Cerium Oxide Particles
a. Preparation of Cerium Oxide Particles A:

2 kg of cerium carbonate hydrate was put in a container made of platinum, and was fired in the air at 800° C. for 2 hours to obtain about 1 kg of yellowish white powder. This powder was phase-determined by X-ray diffraction and was confirmed to be cerium oxide.

The fired powder obtained had particle diameters of 30 to 100 μm. The surfaces of fired-powder particles were observed with a scanning electron microscope, where grain boundaries of cerium oxide were observable. Diameters of cerium oxide crystallites surrounded by grain boundaries were measured to find that the middle value of their distribution was 190 nm and the maximum value was 500 nm.

Next, 1 kg of the fired powder obtained was dry-process pulverized by means of a jet mill. Particles obtained after the pulverization were observed with a scanning electron microscope to find that large polycrystalline particles of 1 μm to 3 μm and polycrystalline particles of 0.5 μm to 1 μm were mixedly present in addition to small single-crystal particles having the same size as the crystallite diameter. The polycrystalline particles were not aggregates of the single-crystal particles. The cerium oxide particles thus obtained by pulverization are hereinafter called cerium oxide particles A.

b. Preparation of Cerium Oxide Particles B:

2 kg of cerium carbonate hydrate was put in a container made of platinum, and was fired in the air at 750° C. for 2 hours to obtain about 1 kg of yellowish white powder. This powder was phase-determined by X-ray diffraction and was confirmed to be cerium oxide. The fired powder obtained had particle diameters of 30 to 100 μm.

The surfaces of fired-powder particles were observed with a scanning electron microscope, where grain boundaries of cerium oxide were observable. Diameters of cerium oxide crystallites surrounded by grain boundaries were measured to find that the middle value of their distribution was 141 nm and the maximum value was 400 nm.

Next, 1 kg of the fired powder obtained was dry-process pulverized by means of a jet mill. Particles obtained after the pulverization were observed with a scanning electron microscope to find that large polycrystalline particles of 1 μm to 3 μm and polycrystalline particles of 0.5 μm to 1 μm were mixedly present in addition to small single-crystal particles having the same size as the crystallite diameter. The polycrystalline particles were not aggregates of the single-crystal particles. The cerium oxide particles thus obtained by pulverization are hereinafter called cerium oxide particles B.

(2) Preparation of Abrasives a. Preparation of Abrasives A & B:

1 kg of the cerium oxide particles A or B obtained in the above (1), 23 g of an aqueous ammonium polyacrylate solution (40% by weight) and 8,977 g of deionized water were mixed, and the mixture was exposed to ultrasonic waves for 10 minutes with stirring to disperse the cerium oxide particles to obtain a slurry.

The slurry thus obtained was filtered with a 1 μm filter, further followed by addition of deionized water to obtain an abrasive with a solid content of 3% by weight. The abrasive obtained from the cerium oxide particles A or B is hereinafter called abrasive A or B, respectively. The abrasive A or B thus obtained had a pH of 8.3 or 8.3, respectively.

In order to observe particles in the abrasive with an scanning electron microscope, the abrasives were each diluted to have a suitable concentration, followed by drying. Then, diameters of polycrystalline particles contained therein were measured to find that, in the case of the abrasive A making use of the cerium oxide particles A, the middle value was 825 nm and the maximum value was 1,230 nm. In the case of the abrasive B making use of the cerium oxide particles B, the middle value was 768 nm and the maximum value was 1,200 nm.

The abrasive A was dried, and the density (bulk density) of the particles obtained was measured to find that it was 5.78 g/ml. Also, the theoretical density measured by X-ray Rietvelt analysis was 7.201 g/ml. The porosity was calculated form these values to find that it was 19.8%. With regard to the particles obtained by drying the slurry, their pore volume was measured by the B.J.H. method to find that it was 0.033 $cm^3/g$.

Next, in order to examine the dispersibility of particles in the abrasive and the electric charges of dispersed particles, zeta potentials of the abrasives A and B were examined. More specifically, the cerium oxide slurry was put in a measuring cell in which electrodes made of platinum were attached to both sidewalls facing each other, and a voltage of 10 V was applied to the both electrodes. Upon application of the voltage, dispersed particles having electric charges migrate to the electrode side having a polarity opposite to that of the electric charges. The rate of this migration was determined to determine the zeta potential of particles. As a result of the measurement of zeta potential, it was ascertained that the dispersed particles of both the abrasives A and B stood negatively charged and had absolute values of as great as −50 mV and −63 mV, respectively, showing a good dispersibility.

b. Preparation of Abrasives A' & B':

1 kg of the cerium oxide particles A or B, 23 g of an aqueous ammonium polyacrylate solution (40% by weight) and 8,977 g of deionized water were mixed, and the mixture was exposed to ultrasonic waves for 10 minutes with stirring to disperse the cerium oxide particles to obtain a slurry.

The slurry thus obtained was filtered with a 0.8 μm filter, further followed by addition of deionized water to obtain an abrasive with a solid content of 3% by weight. The abrasive obtained from the cerium oxide particles A or B is hereinafter called abrasive A' or B', respectively. The abrasives A' or B' thus obtained had a pH of 8.3 or 8.3, respectively.

In order to observe particles in the abrasive with an scanning electron microscope, the abrasives A and B were each diluted to have a suitable concentration. Thereafter, diameters of polycrystalline particles contained therein were measured to find that, in the case of the abrasive A' making use of the cerium oxide particles A, the middle value was 450 nm and the maximum value was 980 nm. In the case of the abrasive B' making use of the cerium oxide particles B, the middle value was 462 nm and the maximum value was 1,000 nm.

Next, in order to examine the dispersibility of particles in the abrasive and the electric charges of dispersed particles, zeta potentials of the abrasives A' and B' were examined in the same manner as the case of the above abrasives A and B. As a result, it was ascertained that the dispersed particles of both the abrasives stood negatively charged and had absolute values of as great as −53 mV and −63 mV, respectively, showing a good dispersibility.

(3) Polishing of Insulating Film

A silicon wafer on which an $SiO_2$ insulating film was formed by TEOS-plasma-assisted CVD was set being attracted and fixed to a substrate-attaching suction pad fastened to a holder. This holder, as it held the silicon wafer, was placed on a platen with the insulating film side down, to which platen a polishing pad made of porous urethane resin was fastened, and a weight was further placed so as to apply a working load of 300 $g/cm^2$.

Next, the platen was rotated at 30 rpm for 2 minutes while dropping the abrasive A, B, A' or B' (solid content: 3% by weight) prepared in the present Example, onto the platen at a rate of 50 ml/minute to polish the insulating film formed on the silicon wafer surface. After the polishing, this wafer (with film) was detached from the holder, and then thoroughly cleaned with water, followed by further cleaning for 20 minutes by means of an ultrasonic cleaner. After the cleaning, this wafer was set on a spin dryer to drive off drops of water, followed by drying for 10 minutes by means of a 120° C. dryer.

With regard to this wafer having been dried, any change in layer thickness of the $SiO_2$ insulating film before and after the polishing was measured with a light interference type layer thickness measuring instrument. As the result, it was found that, when the abrasives A, B, A' and B' were used, the insulating films were abraded by 600 nm (polishing rate: 300 nm/minute), 580 nm (polishing rate: 290 nm/minute), 590 nm (polishing rate: 295 nm/minute) and 560 nm (polishing rate: 280 nm/minute), respectively, and were each in a uniform thickness over the whole wafer surface whichever abrasive was used. Also, the insulating film surfaces were observed using an optical microscope, where any clear scratches were not seen in all the cases.

Using the abrasive A, the $SiO_2$ insulating film on the silicon wafer surface was also polished in the same manner as in the above case, and the particle diameter of the abrasive A after polishing was measured with a centrifugal sedimentation type particle size distribution meter to find that the content (% by volume) of particles not smaller than 0.5 μm was in a ratio of 0.385 with respect to that value before polishing. Here, the time for which the platen was rotated in the course of the polishing was set to be 1 hour, and 15 sheets of silicon wafers with films were polished while changing them successively. Also, the abrasive after polishing was circulated to be reused, and 750 ml of the abrasive was used in total. The particle diameter of the abrasive A after polishing was measured with a laser scattering type particle size distribution meter to find that the particle diameters at D99% and D90% were 0.491 and 0.804, respectively, with respect to the values before polishing. From these values, the abrasive A has the nature of polishing the target while collapsing and the nature of polishing it while producing new surfaces not coming into contact with any medium.

EXAMPLE 2

(2) Preparation of Cerium Oxide Particles a. Preparation of Cerium Oxide Particles C:

2 kg of cerium carbonate hydrate was put in a container made of platinum, and was fired in the air at 700° C. for 2 hours to obtain about 1 kg of yellowish white powder. This powder was phase-determined by X-ray diffraction and was confirmed to be cerium oxide. The fired powder obtained had particle diameters of 30 to 100 μm. The surfaces of fired-powder particles were observed with a scanning electron microscope, where grain boundaries of cerium oxide were observable. Diameters of cerium oxide crystallites surrounded by grain boundaries were measured to find that the middle value of their distribution was 50 nm and the maximum value was 100 nm.

Next, 1 kg of the fired powder obtained was dry-process pulverized by means of a jet mill. Particles obtained after the pulverization were observed with a scanning electron microscope to find that large polycrystalline particles of 2 μm to 4 μm and polycrystalline particles of 0.5 μm to 1.2 μm were mixedly present in addition to small single-crystal particles having the same size as the crystallite diameter. The polycrystalline particles were not aggregates of the single-crystal particles. The cerium oxide particles thus obtained by pulverization are hereinafter called cerium oxide particles C.

b. Preparation of Cerium Oxide Particles D:

3 kg of cerium carbonate hydrate was put in a container made of platinum, and was fired in the air at 700° C. for 2 hours to obtain about 1.5 kg of yellowish white powder. This powder was phase-determined by X-ray diffraction and was confirmed to be cerium oxide. The fired powder obtained had particle diameters of 30 to 100 μm.

The surfaces of fired-powder particles were observed with a scanning electron microscope, where grain boundaries of cerium oxide were observable. Diameters of cerium oxide crystallites surrounded by grain boundaries were measured to find that the middle value of their distribution was 30 nm and the maximum value was 80 nm.

Next, 1 kg of the fired powder obtained was dry-process pulverized by means of a jet mill. Particles obtained after the pulverization were observed with a scanning electron microscope to find that large polycrystalline particles of 1 μm to 3 μm and polycrystalline particles of 0.5 μm to 1 μm were mixedly present in addition to small single-crystal particles having the same size as the crystallite diameter. The polycrystalline particles were not aggregates of the single-crystal particles. The cerium oxide particles thus obtained by pulverization are hereinafter called cerium oxide particles D.

c. Preparation of Cerium Oxide Particles E:

2 kg of cerium carbonate hydrate was put in a container made of platinum, and was fired in the air at 650° C. for 2 hours to obtain about 1 kg of yellowish white powder. This powder was phase-determined by X-ray diffraction and was confirmed to be cerium oxide.

The fired powder obtained had particle diameters of 30 to 100 μm. The surfaces of fired-powder particles were observed with a scanning electron microscope, where grain boundaries of cerium oxide were observable. Diameters of cerium oxide crystallites surrounded by grain boundaries were measured to find that the middle value of their distribution was 15 nm and the maximum value was 60 nm.

Next, 1 kg of the fired powder obtained was dry-process pulverized by means of a jet mill. Particles obtained after the pulverization were observed with a scanning electron microscope to find that large polycrystalline particles of 1 μm to 3 μm and polycrystalline particles of 0.5 μm to 1 μm were mixedly present in addition to small single-crystal particles having the same size as the crystallite diameter. The polycrystalline particles were not aggregates of the single-crystal particles. The cerium oxide particles thus obtained by pulverization are hereinafter called cerium oxide particles E.

d. Preparation of Cerium Oxide Particles F:

2 kg of cerium carbonate hydrate was put in a container made of platinum, and was fired in the air at 600° C. for 2 hours to obtain about 1 kg of yellowish white powder. This powder was phase-determined by X-ray diffraction and was confirmed to be cerium oxide. The fired powder obtained had particle diameters of 30 to 100 μm.

The surfaces of fired-powder particles were observed with a scanning electron microscope, where grain boundaries of cerium oxide were observable. Diameters of cerium oxide crystallites surrounded by grain boundaries were measured to find that the middle value of their distribution was 10 nm and the maximum value was 45 nm.

Next, 1 kg of the fired powder obtained was dry-process pulverized by means of a jet mill. Particles obtained after the pulverization were observed with a scanning electron microscope to find that large polycrystalline particles of 1 μm to 3 μm and polycrystalline particles of 0.5 μm to 1 μm were mixedly present in addition to small single-crystal particles having the same size as the crystallite diameter. The polycrystalline particles were not aggregates of the single-crystal particles. The cerium oxide particles thus obtained by pulverization are hereinafter called cerium oxide particles F.

(2) Preparation of Abrasives a. Preparation of Abrasives C, D, E & F:

1 kg of the cerium oxide particles C, D, E or F obtained in the above (1), 23 g of an aqueous ammonium polyacrylate solution (40% by weight) and 8,977 g of deionized water were mixed, and the mixture was exposed to ultrasonic waves for 10 minutes with stirring to disperse the cerium oxide particles to obtain a slurry.

The slurry thus obtained was filtered with a 2 μm filter, further followed by addition of deionized water to obtain an abrasive with a solid content of 3% by weight. The abrasive obtained from the cerium oxide particles C, D, E or F is hereinafter called abrasive C, D, E or F, respectively. The abrasive C, D, E or F thus obtained had a pH of 8.0, 8.1, 8.4 or 8.4, respectively.

In order to observe particles in the abrasive with an scanning electron microscope, the abrasives were each diluted to have a suitable concentration, followed by drying. Then, diameters of polycrystalline particles contained therein were measured to find that, in the case of the abrasive C making use of the cerium oxide particles C, the middle value was 882 nm and the maximum value was 1,264 nm. In the case of the abrasive D making use of the cerium oxide particles D, the middle value was 800 nm and the maximum value was 1,440 nm. In the case of the abrasive E making use of the cerium oxide particles E, the middle value was 831 nm and the maximum value was 1,500 nm. In the case of the abrasive F making use of the cerium oxide particles F, the middle value was 840 nm and the maximum value was 1,468 nm.

Next, in order to examine the dispersibility of particles in the abrasive and the electric charges of dispersed particles, zeta potentials of the abrasives C, D, E and F were examined in the same manner as in Example 1. As a result, it was ascertained that the particles in all the abrasives stood negatively charged and had absolute values of as great as −64 mV, −35 mV, −38 mV and −41 mV, respectively, showing a good dispersibility.

b. Preparation of Abrasives C', D', E' & F':

1 kg of the cerium oxide particles C, D, E or F obtained in the above (1), 23 g of an aqueous ammonium polyacrylate solution (40% by weight) and 8,977 g of deionized water were mixed, and the mixture was exposed to ultrasonic waves for 10 minutes with stirring to disperse the cerium oxide particles to obtain a slurry.

The slurry thus obtained was filtered with a 0.8 μm filter, further followed by addition of deionized water to obtain an abrasive with a solid content of 3% by weight. The abrasive obtained from the cerium oxide particles C', D', E' or F' is hereinafter called abrasive C', D', E' or F', respectively. The abrasive C', D', E' or F' thus obtained had a pH of 8.0, 8.1, 8.4 or 8.4, respectively.

In order to observe particles in the abrasive with an scanning electron microscope, the abrasives C', D', E' and F' were each diluted to have a suitable concentration, followed by drying. Then, diameters of polycrystalline particles contained therein were measured to find that, in the case of the abrasive C' making use of the cerium oxide particles C, the middle value was 398 nm and the maximum value was 890 nm. In the case of the abrasive D' making use of the cerium oxide particles D, the middle value was 405 nm and the maximum value was 920 nm. In the case of the abrasive E' making use of the cerium oxide particles E, the middle value was 415 nm and the maximum value was 990 nm. In the case of the abrasive F' making use of the cerium oxide particles F, the middle value was 450 nm and the maximum value was 1,080 nm.

Next, in order to examine the dispersibility of particles in the abrasive and the electric charges of dispersed particles, zeta potentials of the respective abrasives were examined in the same manner as in Example 1. As a result, it was ascertained that the dispersed particles of all the abrasives stood negatively charged and had absolute values of as great as −58 mV, −55 mV, −44 mV and −40 mV, respectively, showing a good dispersibility.

(3) Polishing of Insulating Film

An $SiO_2$ insulating film formed on a silicon wafer surface was polished, cleaned and dried and any change in layer thickness of the $SiO_2$ insulating film was measured all in the same manner as in Example 1 except for using the abrasive C, D, E, F, C', D', E' or F' prepared in the present Example. As the result, it was found that, when the abrasives C, D, E, F, C', D', E' and F' were used, the insulating films were abraded by 740 nm (polishing rate: 370 nm/minute), 730 nm (polishing rate: 365 nm/minute), 750 nm. (polishing rate: 375 nm/minute), 720 nm (polishing rate: 360 nm/minute), 700 nm (polishing rate: 350 nm/minute), 690 nm (polishing rate: 345 nm/minute), 710 nm (polishing rate: 355 nm/minute) and 710 nm (polishing rate: 355 nm/minute), respectively, and were each in a uniform thickness over the whole wafer surface whichever abrasive was used. Also, the insulating film surfaces were observed using an optical microscope, where any clear scratches were not seen in all the cases.

COMPARATIVE EXAMPLE

An $SiO_2$ insulating film formed on a silicon wafer surface by TEOS-CVD was polished in the same manner as in Examples 1 and 2 except for using as an abrasive a slurry prepared by dispersing silica having no pores. This slurry had a pH of 10.3, and contained 12.5% by weight of $SiO_2$ particles. Polishing conditions were the same as those in Examples 1 and 2.

The insulating film after polishing was observed, where, although no scratches due to polishing were seen and the surface was uniformly polished, the insulating film was abradable by only 150 nm (polishing rate: 75 nm/minute) as a result of the polishing for 2 minutes.

POSSIBILITY OF INDUSTRIAL APPLICATION

As described above, the present invention makes it possible to polish polishing target surfaces of $SiO_2$ insulating films or the like at a high rate without scratching the surface.

What is claimed is:

1. An abrasive comprising a slurry which comprises a medium and cerium oxide particles dispersed in said medium, wherein said cerium oxide particles comprise a cerium oxide particle constituted of at least two crystallites and having crystal grain boundaries, and the slurry further comprises an acrylic acid polymer as a dispersant, wherein said cerium oxide particle constituted of at least two crystallites and having crystal grain boundaries has a property of polishing a target member while forming new surfaces of said cerium oxide particle not coming into contact with any of said medium.

2. The abrasive according to claim 1, wherein said cerium oxide particles have a cerium oxide particle having a pore.

3. The abrasive according to claim 2, wherein said cerium oxide particles have a porosity of from 10% to 30% as determined from the ratio of a true density measured with a pycnometer to a theoretical density determined by X-ray Rietvelt analysis.

4. The abrasive according to claim 2, wherein the cerium oxide particles have a pore volume of from 0.02 cm$^3$/g to 0.05 cm$^3$/g as measured by the Barret, Joyner and Halende (B.J.H.) method.

5. The abrasive according to claim 1, wherein said cerium oxide particles have a bulk density not higher than 6.5 g/cm$^3$.

6. The abrasive according to claim 5, wherein said bulk density is from 5.0 g/cm$^3$ to 5.9 g/cm$^3$.

7. The abrasive according to claim 1, wherein said acrylic acid polymer is at least one selected from the group consisting of polyacrylic acid and ammonium salts thereof, polymethacrylic acid and ammonium salts thereof, and copolymers of ammonium polyacrylate with alkyl acrylates.

8. The abrasive according to claim 1, wherein said acrylic acid polymer is selected from the group consisting of ammonium polyacrylate and copolymers of ammonium polyacrylate with alkyl acrylates.

9. The abrasive according to claim 8, wherein said acrylic acid polymer comprises a copolymer of ammonium polyacrylate with methyl acrylate which is formed in the molar ratio of ammonium polyacrylate/methyl acrylate of from 10/90 to 90/10.

10. The abrasive according to claim 1, wherein said dispersant further comprises at least one selected from the group consisting of a water-soluble organic polymer, a water-soluble anionic surfactant, a water-soluble nonionic surfactant and a water-soluble amine.

11. A slurry which comprises a medium and cerium oxide particles dispersed in said medium, wherein said cerium oxide particles comprise a cerium oxide particle constituted of at least two crystallites and having crystal grain boundaries, and the slurry further comprises an acrylic acid polymer as a dispersant,
   wherein said cerium oxide particle constituted of at least two crystallites and having crystal grain boundaries has a property of polishing a target member while forming new surfaces of said cerium oxide particle not coming into contact with any of said medium.

12. The slurry according to claim 11, wherein said cerium oxide particles have a cerium oxide particle having a pore.

13. The slurry according to claim 12, wherein the cerium oxide particles have a porosity of from 10% to 30% as determined from the ratio of a true density measured with a pycnometer to a theoretical density determined by X-ray Rietvelt analysis.

14. The slurry according to claim 12, wherein the cerium oxide particles have a pore volume of from 0.02 $cm^3$/g to 0.05 $cm^3$/g as measured by the Barret, Joyner and Halende (B.J.H.) method.

15. The slurry according to claim 11, wherein said acrylic acid polymer is at least one selected from the group consisting of polyacrylic acid and ammonium salts thereof, polymethacrylic acid and ammonium salts thereof, and copolymers of ammonium polyacrylate with alkyl acrylates.

16. The slurry according to claim 11, wherein said acrylic acid polymer is selected from ammonium polyacrylate and copolymers of ammonium polyacrylate with alkyl acrylates.

17. The slurry according to claim 11, wherein said acrylic acid polymer comprises a copolymer of ammonium polyacrylate with methyl acrylate which is formed in the molar ratio of ammonium polyacrylate/methyl acrylate of from 10/90 to 90/10.

18. The slurry according to claim 11, wherein said dispersant further comprises at least one selected from the group consisting of a water-soluble organic polymer, a water-soluble anionic surfactant, a water-soluble nonionic surfactant and a water-soluble amine.

19. The abrasive according to claim 1, wherein the slurry has a pH of from 7 to 10.

20. The slurry according to claim 11, wherein the slurry has a pH of from 7 to 10.

* * * * *